United States Patent
Maeyama et al.

(10) Patent No.: US 9,587,094 B2
(45) Date of Patent: Mar. 7, 2017

(54) RESIN COMPOSITION FOR SOLAR CELL ENCAPSULANT, AND SOLAR CELL ENCAPSULANT AND SOLAR CELL MODULE USING THE SAME

(71) Applicant: JAPAN POLYETHYLENE CORPORATION, Chiyoda-ku (JP)

(72) Inventors: Tomoaki Maeyama, Kanagawa (JP); Masahiro Ueno, Kanagawa (JP)

(73) Assignee: JAPAN POLYETHYLENE CORPORATION, Chiyoda-ku (JP)

(*) Notice: Subject to any disclaimer, the term of this patent is extended or adjusted under 35 U.S.C. 154(b) by 0 days.

(21) Appl. No.: 14/768,123

(22) PCT Filed: Feb. 13, 2014

(86) PCT No.: PCT/JP2014/053247
§ 371 (c)(1),
(2) Date: Aug. 14, 2015

(87) PCT Pub. No.: WO2014/126121
PCT Pub. Date: Aug. 21, 2014

(65) Prior Publication Data
US 2016/0002440 A1    Jan. 7, 2016

(30) Foreign Application Priority Data
Feb. 15, 2013 (JP) ................. 2013-027654

(51) Int. Cl.
*C08L 23/08* (2006.01)
*C08K 5/14* (2006.01)
*H01L 31/048* (2014.01)
*C08K 5/3435* (2006.01)

(52) U.S. Cl.
CPC ............... *C08L 23/08* (2013.01); *C08K 5/14* (2013.01); *C08K 5/3435* (2013.01); *C08L 23/0815* (2013.01); *H01L 31/0481* (2013.01); *Y02E 10/50* (2013.01)

(58) Field of Classification Search
CPC ......... C08K 5/14; C08K 5/3435; C08L 23/08; C08L 23/0815; H01L 31/0481; Y02E 10/50
See application file for complete search history.

(56) References Cited

U.S. PATENT DOCUMENTS

| 8,697,984 | B2 | 4/2014 | Amamiya et al. |
| 2007/0267059 | A1 | 11/2007 | Nishijima et al. |
| 2008/0078445 | A1 | 4/2008 | Patel et al. |
| 2009/0120489 | A1 | 5/2009 | Nishijima et al. |
| 2010/0313956 | A1 | 12/2010 | Nishijima et al. |
| 2011/0290317 | A1 | 12/2011 | Naumovitz et al. |
| 2012/0000514 | A1 | 1/2012 | Amamiya et al. |
| 2013/0118583 | A1 | 5/2013 | Patel et al. |
| 2013/0125986 | A1 | 5/2013 | Nishijima et al. |
| 2013/0137833 | A1 | 5/2013 | Amamiya et al. |
| 2013/0167909 | A1 | 7/2013 | Amamiya et al. |

FOREIGN PATENT DOCUMENTS

| CN | 101065438 A | 10/2007 |
| EP | 1 837 372 A1 | 9/2007 |
| JP | 58 23870 | 2/1983 |
| JP | 2006 210906 | 8/2006 |
| JP | 2010 504647 | 2/2010 |
| JP | 2012 9688 | 1/2012 |
| JP | 2012 9691 | 1/2012 |
| WO | 2006 095762 | 9/2006 |
| WO | 2010 114028 | 10/2010 |
| WO | 2011 150193 | 12/2011 |
| WO | 2012 066923 | 5/2012 |

OTHER PUBLICATIONS

International Search Report Issued Apr. 8, 2014 in PCT/JP14/053247 Filed Feb. 13, 2014.
Office Action Issued Apr. 8, 2014 in Corresponding Application No. JP 2014-025055 Filed Feb. 13, 2014 with English Translation.
Extended European Search Report issued Aug. 25, 2016 in Patent Application No. 14752203.1.
Combined Chinese Office Action and Search Report issued on May 9, 2016 in Patent Application No. 201480008774.7 (with partial English language translation and English language translation of categories of cited documents).

*Primary Examiner* — Robert Jones, Jr.
(74) *Attorney, Agent, or Firm* — Oblon, McClelland, Maier & Neustadt, L.L.P.

(57) ABSTRACT

Provided are a resin composition for solar cell encapsulant which contains an ethylene/α-olefin and is satisfactory in terms of crosslinkability, heat resistance, transparency, and impact resistance, a solar cell encapsulant formed from the resin composition, and a solar cell module obtained using the resin composition. Provided are a resin composition for solar cell encapsulant and the likes, which comprises an ethylene/α-olefin copolymer (A) having the following properties (a1) to (a3) and organic peroxide (B):

(a1) a branch number derived from comonomer (N) and a total number of vinyl and vinylidene (V) in the ethylene/α-olefin copolymer satisfy the following relationship of expression (1): N×V≥10, wherein N and V are the number, as determined by NMR, per total of 1,000 carbon atoms contained in the main chain and side chain, (a2) an MFR (190° C., 21.18-N load) is 0.1-100 g/10 min, and (a3) a density is 0.860-0.920 g/cm³.

12 Claims, 1 Drawing Sheet

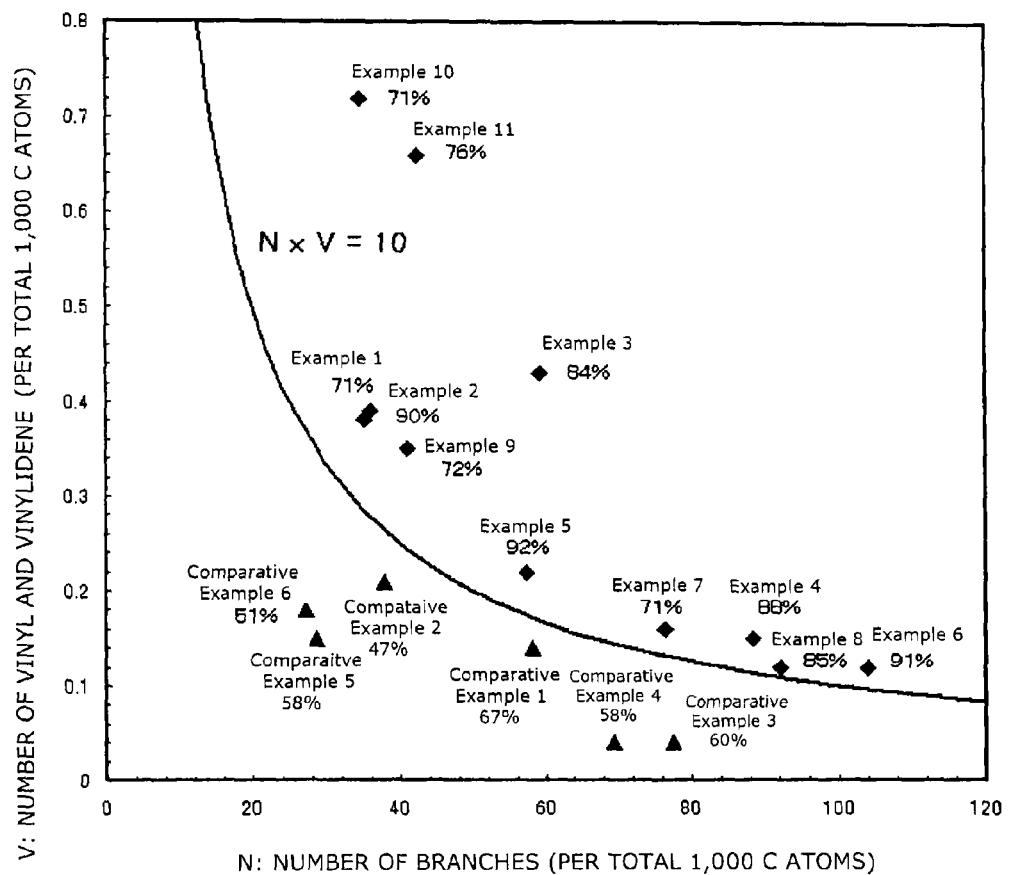

RESIN COMPOSITION FOR SOLAR CELL ENCAPSULANT, AND SOLAR CELL ENCAPSULANT AND SOLAR CELL MODULE USING THE SAME

TECHNICAL FIELD

The present invention relates to a resin composition for solar cell encapsulant and to a solar cell encapsulant and a solar cell module using the same. More particularly, the invention relates to a resin composition for solar cell encapsulant which includes an ethylene/α-olefin copolymer and organic peroxide and is excellent in terms of crosslinking property, heat resistance, transparency, and impact resistance, and to a solar cell encapsulant and a solar cell module each formed from or obtained using the same.

BACKGROUND ART

Under the present circumstances in which global environmental issues including the increased emission of carbon dioxide are emphasized, solar light power generation has come to receive attention again, besides the effective utilization of water power, wind force, geotherm, etc.

For solar light power generation, use is generally made of a solar cell module produced by protecting a solar cell element, such as a silicon, gallium-arsenic, or copper-indium-selenium element, with an upper transparent protective material and a lower substrate protective material and fixing the solar cell element and each protective material to each other with a resinous encapsulant to fabricate a package thereof. Since such solar cell modules can be disposed scatteringly in places where electric power is necessary, although on small scales as compared with electric-power generation by water power, wind force, etc., researches and developments are being pursued with the aim of improving performances, e.g., power generation efficiency, and reducing the cost. In addition, since the country and municipal corporations are taking a policy for helping with installation costs as an undertaking for introducing residential solar cell power generation systems, the systems are spreading gradually. However, further reductions in cost are necessary for further spread. Consequently, not only investigations for developing a solar cell element employing a new material, as a substitute for the conventional silicon, gallium-arsenic, and other elements, but also efforts to further reduce the cost of solar cell module production are being steadily continued.

With respect to requirements for the solar cell encapsulant as a constituent component of a solar cell module, the encapsulant is required to have satisfactory transparency from the standpoint of ensuring the quantity of incident solar light so as not to reduce the power generation efficiency of the solar cell. Meanwhile, solar cell modules are usually installed outdoors and hence heat up as a result of long-term exposure to solar light. From the standpoint of avoiding the trouble that the resinous encapsulant flows due to the heating-up to cause a module deformation or the like, the encapsulant must be one having heat resistance. Furthermore, thickness reductions are being advanced year by year in order to reduce the cost of materials for solar cell elements, and a encapsulant having excellent impact resistance is also desired from the standpoint of cell protection.

For example, a composition obtained by incorporating organic peroxide into an ethylene/vinyl acetate copolymer (EVA) having a high vinyl acetate content to impart a crosslinked structure thereto has conventionally been employed as encapsulant in solar cell modules from the standpoints of cost, processability, moisture resistance, etc. (see, for example, patent document 1). However, such ethylene/vinyl acetate copolymer (EVA) resins, when used over a prolonged period, suffer deteriorations or alterations, such as yellowing, cracking, and foaming, and hence decrease in moisture resistance. Use of these resins has thus resulted in a decrease in power generation amount due to the corrosion of the solar cells, etc. These deteriorations are thought to be because the EVA resins have a highly hydrolyzable ester structure and are hence prone to be affected by solar light and water.

An encapsulant for solar cell modules which includes a noncrystalline or lowly crystalline α-olefin-based copolymer having a degree of crystallinity of 40% or less has hence been proposed (see patent document 2). Patent document 2 shows an example in which organic peroxide is incorporated into a lowly crystalline ethylene/butene copolymer and a sheet is produced from the mixture using a profile extruder at a processing temperature of 100° C. However, there is a problem in that the production efficiency cannot be heightened because of the low processing temperature.

Also proposed as a encapsulant for solar cell modules is a polymeric material including a polyolefin copolymer which satisfies one or more of the following requirements: (a) a density less than about 0.90 g/cc, (b) a 2% secant modulus, as determined in accordance with ASTM D-882-02, of less than about 150 megapascals (MPa), (c) a melting point lower than about 95° C., (d) an α-olefin content of at least about 15 and less than about 50% by weight based on the weight of the polymer, (e) a Tg of less than about −35° C., and (f) an SCBDI of at least about 50 (see patent document 3).

In solar cell modules, the solar cell encapsulant tend to become thinner as the thickness of the solar cell elements is reduced. This tendency has posed a problem in that the solar cell module is prone to suffer wire breakage when an impact is given thereto from the upper or lower protective material side of the solar cell encapsulant. Although it is desired to heighten the rigidity of the encapsulant in order to mitigate the problem, the polymeric material of patent document 3 has had a problem in that heightening the rigidity thereof results in impaired crosslinking efficiency.

As described above, a resin composition for solar cell encapsulant which is excellent in terms of crosslinking property, heat resistance, transparency, and impact resistance has not been obtained with any conventional technique.

PRIOR ART DOCUMENTS

Patent Documents

Patent Document 1: JP-A-58-023870
Patent Document 2: JP-A-2006-210906
Patent Document 3: JP-T-2010-504647 (the term "JP-T" as used herein means a published Japanese translation of a PCT patent application)
Patent Document 4: JP-A-2012-009688
Patent Document 5: JP-A-2012-009691

SUMMARY OF THE INVENTION

Problems that the Invention is to Solve

An object of the invention, in view of those problems of prior-art techniques, is to provide: a resin composition for solar cell encapsulant which includes an ethylene/α-olefin copolymer, organic peroxide, etc. and which is excellent in terms of crosslinking property, heat resistance, transparency, and impact resistance; and a solar cell encapsulant and a solar cell module using the same.

Means for Solving the Problems

The present inventors diligently made investigations in order to eliminate the problems. As a result, the inventors have discovered that a resin composition for solar cell encapsulant which is excellent in terms of crosslinkability, heat resistance, transparency, and impact resistance is obtained by selecting, as a resinous component, a specific ethylene/α-olefin copolymer which satisfies a specific requirement concerning the branch number derived from comonomer in the copolymer and the number of vinyl and vinylidene therein and by incorporating organic peroxide thereinto, and that the efficiency of production of solar cell modules is greatly improved by using the resin composition. The present invention has been thus completed.

According to the first aspect of the present invention, a resin composition for solar cell encapsulant, which comprises the following component (A) and component (B) is provided.

component (A): an ethylene/α-olefin copolymer having the following properties (a1) to (a3):
(a1) a branch number derived from comonomer (N) and a total number of vinyl and vinylidene (V) in the ethylene/α-olefin copolymer satisfy the following relationship of expression (1):

$$N \times V \geq 10 \qquad \text{expression (1)}$$

wherein N and V are the number, as determined by NMR, per total of 1,000 carbon atoms contained in the main chain and side chain,
(a2) an MFR (190° C., 21.18-N load) is 0.1-100 g/10 min, and
(a3) a density is 0.860-0.920 g/cm³,
component (B): organic peroxide.

According to the second aspect of the present invention, the resin composition for solar cell encapsulant in the first aspect of the present invention, wherein the component (A) is an ethylene/α-olefin copolymer which further has the following property (a4), is provided.
(a4) a branch number derived from comonomer (N) in the ethylene/α-olefin copolymer satisfies the following relationship of expression (2):

$$0 < N < 54.0 \qquad \text{expression (2)}$$

wherein N is the number, as determined by NMR, per total of 1,000 carbon atoms contained in the main chain and side chains.

According to the third aspect of the present invention, the resin composition for solar cell encapsulant in the first or second aspect of the present invention, wherein the content of component (B) is 0.2-5 parts by weight per 100 parts by weight of component (A), is provided.

According to the fourth aspect of the present invention, the resin composition for solar cell encapsulant in any one of the first to third aspects of the present invention, which further comprises the following component (C), is provided.
component (C): a hindered amine-type light stabilizer According to the fifth aspect of the present invention, the resin composition for solar cell encapsulant in the fourth aspect of the present invention, wherein the content of component (C) is 0.01-2.5 parts by weight per 100 parts by weight of component (A), is provided.

According to the sixth aspect of the present invention, the resin composition for solar cell encapsulant in any one of the first to fifth aspects of the present invention, wherein the number of carbon atoms in the α-olefin of component (A) is 8-20, is provided.

According to the seventh aspect of the present invention, the resin composition for solar cell encapsulant in any one of the first to sixth aspects of the present invention, wherein the α-olefin of component (A) is 1-octene, is provided.

According to the eighth aspect of the present invention, a solar cell encapsulant formed from the resin composition for solar cell encapsulant according to any one of any one of the first to seventh aspects of the present invention, is provided.

According to the ninth aspect of the present invention, a solar cell module using the solar cell encapsulant according to the eighth aspect of the present invention is provided.

Effects of the Invention

The resin composition for solar cell encapsulant of the invention contains as the main component an ethylene/α-olefin copolymer which satisfies a specific requirement concerning the number of branches and the number of vinyl and vinylidene, and organic peroxide has been incorporated thereinto. Because of this, when this resin composition is formed into a sheet, the ethylene/α-olefin copolymer can be crosslinked in a relatively short time period. This sheet can be used as a solar cell encapsulant to easily fabricate a module, and a reduction in production cost can be attained. The solar cell module obtained is excellent in terms of crosslinking property, heat resistance, transparency, impact resistance, etc., and can be expected to retain a stable conversion efficiency over a prolonged period.

BRIEF DESCRIPTION OF THE DRAWING

FIG. 1 is a chart showing a relationship between the number of branches (N) and the number of vinyl and vinylidene (V) in Examples and Comparative Examples.

MODES FOR CARRYING OUT THE INVENTION

The present invention relates to a novel resin composition for solar cell encapsulant which includes a specific ethylene/α-olefin copolymer as a resinous component and organic peroxide, and to a solar cell encapsulant and a solar cell module each formed from or obtained using the resin composition.

Detailed explanations are given below on each component to be used in the invention, the resin composition for solar cell encapsulant obtained, the solar cell encapsulant formed therefrom, the solar cell module obtained using the same, etc.

1. Resin Composition for Solar Cell Encapsulant

The resin composition for solar cell encapsulant (hereinafter also referred to simply as resin composition) of the invention is characterized by including component (A), which is an ethylene/α-olefin copolymer, and component (B), which is organic peroxide.

(1) Component (A)

Component (A) used in the invention is an ethylene/α-olefin copolymer which has the following properties (a1) to (a3).
(a1) The branch number derived from comonomer (N) and the total number of vinyl and vinylidene (V) in the ethylene/α-olefin copolymer satisfy the following relationship of expression (1):

$$N \times V \geq 10 \qquad \text{expression (1)}$$

(wherein N and V are the numbers, as determined by NMR, per total of 1,000 carbon atoms contained in the main chain and side chains; number/total 1,000 C atoms).
(a2) To have an MFR (190° C., 21.18-N load) of 0.1-100 g/10 min.
(a3) To have a density of 0.860-0.920 g/cm³.

Since these properties are satisfied, the resin composition of the invention has satisfactory crosslinking property, heat resistance, and transparency.
(i) Properties of Component (A)
(a1) Relationship between Branch number derived from comonomer (N) and Number of Vinyl and Vinylidene (V)

It is important that in the ethylene/α-olefin copolymer to be used in the invention, the branch number derived from comonomer (N) and the total number of vinyl and vinylidene (V) satisfy the following expression (1).

$$N \times V \geq 10 \qquad \text{Expression (1)}$$

In the expression, the number of branches (N) and the number of vinyl and vinylidene (V) are the numbers, as determined by NMR, per total of 1,000 carbon atoms contained in the main chain and side chains (number/total 1,000 C atoms).

The structures of vinyl and vinylidene are shown below. In the following formulae, R1 represents a polymer main chain and R2 represents a methyl group or a polymer main chain.

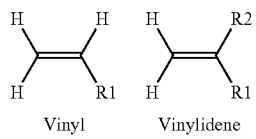

[Chem. 1]

Vinyl       Vinylidene

Hitherto, it was reported that improved crosslinking properties were obtained by using, as a resin composition for solar cell encapsulant, an ethylene/α-olefin copolymer having a large number of double bonds (see patent document 4). It was also reported that an ethylene/α-olefin copolymer having a large number of double bonds had satisfactory crosslinking properties (see patent document 5).

The double bonds which may be contained in ethylene/α-olefin copolymers include various double bonds (vinyl, vinylidene, cis-vinylene, trans-vinylene, and trisubstituted vinylene). However, those documents do not mention an influence of a difference in the kind of these double bonds on any difference in the degree of contribution to impartation of crosslinking properties. Furthermore, although the number of branches and the number of double bonds in an ethylene/α-olefin copolymer can be independently controlled, those documents make no mention of as to whether or not it is necessary that only either of the two should be satisfied for imparting crosslinking properties.

The present inventors hence diligently made investigations and, as a result, have discovered that 1) of the double bonds contained in ethylene/α-olefin copolymers, vinyl and vinylidene are important for impartation of crosslinking properties and 2) an improvement in crosslinking efficiency can be attained in the case where the total number of vinyl and vinylidene and the number of branches in the polymer satisfy expression (1), as shown in FIG. 1. The invention has been thus completed.

Patent document 5 discloses a resin composition for solar cell encapsulant which has a specific number (N) of comonomer-derived branches and has satisfactory crosslinking properties. However, the present inventors found that this composition has a problem in that the composition shows poor non-blocking properties when molded into sheet.

The present inventors hence made further investigations and, as a result, have discovered that so long as an ethylene/α-olefin copolymer satisfies a density of 0.860-0.920 g/cm³, a resin composition having excellent crosslinking properties and showing improved non-blocking properties during sheet molding is obtained when the copolymer satisfies expression (1) and the number of branches (N) therein is within the range shown by the following expression (2).

$$0 < N < 54.0 \qquad \text{Expression (2):}$$

(In the expression, N is the number, as determined by NMR, per total of 1,000 carbon atoms contained in the main chain and side chains.)

Incidentally, the branch number derived from comonomer (N) in a polymer can be calculated from a $^{13}$C-NMR spectrum with reference to, for example, E. W. Hansen, R. Blom, and O. M. Bade, *Polymer*, Vol.36, p.4295 (1997).

The branch number derived from comonomer (N) in a polymer can be regulated by changing polymerization conditions such as the amount of the α-olefin to be added during production, polymerization temperature, etc.

The number of vinyl and vinylidene (V) in the ethylene/α-olefin copolymer is preferably 0.10 (units/total of 1,000 C atoms) or larger, more preferably 0.12 or larger, even more preferably 0.17 or larger, especially preferably 0.2 or larger, so long as expression (1) is satisfied. There is no particular upper limit on the number (V). However, the number (V) is preferably 5.0 or less, and is more preferably 3.0 or less, especially preferably 1.5 or less, from the standpoint of the thermal stability of the resin.

The amount of vinyl and that of vinylidene are not particularly limited. However, the number of vinyl and that of vinylidene are each preferably, for example, 0.05 or larger.

Here, the number of vinyl and that of vinylidene can be determined by $^1$H-NMR spectroscopy. The number of vinyl and that of vinylidene in a polymer are determined, through an examination by $^1$H-NMR spectroscopy, in terms of the number thereof per total of 1,000 carbon atoms contained in the main chain and side chains. Specifically, the number of vinyl per 1,000 carbon atoms was calculated from the area of the peak(s) assigned to saturated alkyl chains and appearing in the chemical shift range of 0.4-2.8 ppm, and from the area of the peak assigned to vinyl and appearing at around 4.9 ppm. The number of vinylidene was calculated using the characteristic peak appearing at around 4.7 ppm.

The number of vinyl and that of vinylidene can be regulated by changing production conditions, e.g., polymerization temperature, or by using a diene compound as a comonomer.
(a2) MFR The ethylene/α-olefin copolymer to be used in the invention has an MFR of 0.1-100 g/10 min, preferably 5-50 g/10 min, more preferably 20-40 g/10 min. In case where the MFR of the ethylene/a-olefin copolymer is less than 0.1 g/10 min, this copolymer has too high a molecular weight, whereby the extrusion during kneading becomes difficult. Meanwhile, in case where the MFR thereof exceeds 100 g/10 min, this copolymer has too low a melt viscosity and shows poor handleability. The MFR of an ethylene/α-olefin copolymer is measured in accordance with JIS-K6922-2: 1997 appendix (190° C., 21.18-N load).

(a3) Density

The ethylene/α-olefin copolymer to be used in the invention has a density of 0.860-0.920 g/cm³, preferably 0.865-0.915 g/cm³, more preferably 0.870-0.900 g/cm³. In case where the density of the ethylene/α-olefin copolymer is less than 0.860 g/cm³, the sheet obtained through processing undesirably suffers blocking. Meanwhile, in case where the density thereof exceeds 0.920 g/cm³, the sheet obtained through processing is so rigid that the handleability thereof is poor.

For regulating the density of the polymer, for example, a method of properly regulating α-olefin content, polymerization temperature, catalyst amount, etc. is used. Incidentally, the density of an ethylene/α-olefin copolymer is measured (23° C.) in accordance with JIS-K6922-2: 1997 appendix (in the case of low-density polyethylene).

(ii) Monomer Configuration of Component (A)

The ethylene/α-olefin copolymer to be used in the invention is a random copolymer of ethylene and one or more a-olefins, wherein the constituent units derived from ethylene are a main component.

The α-olefins usable as comonomers are α-olefins having 3-50 carbon atoms, and preferably are α-olefins having 8-20 carbon atoms. Specific examples thereof include propylene, 1-butene, 1-pentene, 1-hexene, 1-heptene, 1-octene, 1-nonene, 1-decene, 1-undecene, 1-dodecene, vinylbenzene, 5-vinyl-2-norbornene, 1-methyl-1-pentene, 4 methyl-1-hexene, and 4,4-dimethyl-1-pentene. Preferred of these are 1-octene, 1-nonene, 1-decene, 1-undecene, 1-dodecene, and vinylbenzene. Especially preferred is 1-octene.

In solar cell modules, due to the trend toward thickness reduction in the solar cell elements, the solar cell encapsulant also is required to have a reduced thickness. Solar cell encapsulant having a reduced thickness are required to have enhanced rigidity from the standpoint of preventing wire breakage from occurring when an impact is given from the upper or lower protective material side.

From the standpoint of improving impact resistance, it is preferable that the α-olefins to be used as comonomers should be α-olefins having 8-20 carbon atoms. Of these, it is preferred to use 1-octene, 1-nonene, 1-decene, 1-undecene, 1-dodecene, vinylbenzene, or the like. In the case where these α-olefins are used, the resultant copolymer has an increased tensile modulus and shows excellent impact resistance.

In general, however, α-olefins having a large number of carbon atoms have a problem in that the copolymerizability thereof is poor. The inventors hence made investigations, and have found that a encapsulant having not only improved crosslinking properties and non-blocking properties but also heightened rigidity is obtained in cases when an ethylene/α-olefin copolymer which satisfies expression (1) and expression (2) is produced using, in particular, 1-octene as a comonomer.

In Examples of the invention also, in the case where 1-octene was used as a comonomer, the copolymers obtained had excellent crosslinking properties and were excellent in terms of tensile modulus and non-blocking property as compared with the case where other comonomers, i.e., 1-propene, 1-butene, and 1-hexene, were used.

One α-olefin may be used, or two or more α-olefins may be used in combination.

Diene compounds such as 1,5-hexadiene, 1,6-heptadiene, 1,7-octadiene, 1,8-nonadiene, and 1,9-decadiene may be added as comonomers in a small amount to the α-olefin(s). The addition of these diene compounds results in formation of long branches, and these long branches not only reduce the crystallinity of the ethylene/α-olefin copolymer to improve the transparency, flexibility, adhesiveness, etc. but also serve as an intermolecular crosslinking agent, thereby enhancing the mechanical strength. In addition, since the terminal groups of such long branches are unsaturated groups, it is easy to cause the copolymer to undergo a crosslinking reaction with organic peroxide or to undergo a copolymerization reaction or grafting reaction with a compound containing an acid anhydride group or a compound containing an epoxy group. As a diene compound to be added in a small amount to the α-olefin(s), use can be made of a cyclic diene such as 5-vinyl-2-norbornene or 5-ethylidene-2-norbornene.

The ethylene/α-olefin copolymer to be used in the invention has an α-olefin content of preferably 5-40% by weight, more preferably 10-35% by weight, especially preferably 15-35% by weight. So long as the α-olefin content thereof is within that range, a flexibility of films and the like and a heat resistance after crosslinking, become excellent.

(iii) Polymerization Catalysts for Component (A) and Polymerization Methods

The ethylene/α-olefin copolymer to be used in the invention can be produced using a catalyst such as a Ziegler catalyst, vanadium catalyst, metallocene catalyst, or the like, preferably using a vanadium catalyst or a metallocene catalyst, more preferably using a metallocene catalyst. Examples of production processes include a high-pressure ionic polymerization method, vapor-phase method, solution method, and slurry method. It is especially preferred to utilize a high-pressure method such as a high-pressure ionic polymerization method.

The metallocene catalyst is not particularly limited, and examples thereof include a catalyst configured of a metallocene compound, such as a zirconium compound in which, for example, a group having a cyclopentadienyl framework has coordinated, and a promoter as catalyst components. It is especially preferred to use a metallocene compound such as a zirconium compound in which, for example, a group having a cyclopentadienyl framework has coordinated. Examples of commercial products thereof include Harmorex series and Kernel series, manufactured by Japan Polyethylene Corp., Evolue series, manufactured by Prime Polymer Co., Ltd., Excellen GMH series and Excellen FX series, manufactured by Sumitomo Chemical Co., Ltd., Engage series, manufactured by The Dow Chemical Co., and Exact series, manufactured by Exxon Mobil Corp. Examples of the vanadium catalyst include a catalyst configured of a soluble vanadium compound and an organoaluminum halide as catalyst components.

(2) Component (B)

The organic peroxide, as component (B) in the invention, is used mainly in order to crosslink component (A).

As the organic peroxide, use can be made of organic peroxide having a decomposition temperature (temperature at which the half-value period is 1 hour) of 70-180° C., in particular, 90-160° C. Examples of such organic peroxides include t-butyl peroxyisopropyl carbonate, t-butyl peroxy-2-ethylhexyl carbonate, t-butyl peroxyacetate, t-butyl peroxybenozate, dicumyl peroxide, 2,5-dimethyl-2,5-di(t-butylperoxy)hexane, di-t-butyl peroxide, 2,5-dimethyl-2,5-di(t-butylperoxy)hexyne-3, 1,1-di (t-butylperoxy)-3,3,5-trimethylcyclohexane, 1,1-di(t-butylperoxy)cyclohexane, methyl ethyl ketone peroxide, 2,5-dimethylhexyl-2,5-diperoxybenzoate, t-butyl hydroperoxide, p-menthane hydroperoxide, benzoyl peroxide, p-chlorobenzoyl peroxide, t-butyl peroxyisobutyrate, hydroxyheptyl peroxide, and cyclohexanone peroxide.

The proportion of component (B), per 100 parts by weight of component (A), is preferably 0.2-5 parts by weight, more preferably 0.5-3 parts by weight, even more preferably 1-2 parts by weight. In case where the proportion of component (B) is less than that range, the copolymer is not crosslinked or requires much time for crosslinking. Meanwhile, in case where the proportion thereof is larger than that range, component (B) tends to be insufficiently dispersed and unevenness in the degree of crosslinking is prone to result.

(3) Component (C)

It is preferable in the invention that a hindered amine-type light stabilizer should be incorporated as component (C) into the resin composition. A hindered amine-type light stabilizer serves to scavenge radical species harmful to the polymer and prevent radical from newly generating. Examples of the hindered amine-type light stabilizer include many kinds of compounds ranging from low-molecular-weight ones to high-molecular-weight ones, and conventionally known ones can be used without particular limitations.

Examples of the hindered amine-type light stabilizers having a low molecular weight include: one composed of 70% by weight product (molecular weight, 737) of a reaction among bis(2,2,6,6-tetramethyl-1-(octyloxy)-4-piperidinyl) decanedioate, 1,1-dimethylethyl hydroperoxide, and octane and 30% by weight polypropylene; bis(1,2,2,6,6-pentamethyl-4-piperidyl) [[3,5-bis(1,1-dimethylethyl)-4-hydroxyphenyl]methyl]butylmalonate (molecular weight, 685); a mixture (molecular weight, 509) of bis(1,2,2,6,6-pentamethyl-4-piperidyl) sebacate and methyl-1,2,2,6,6-pentamethyl-4-piperidyl sebacate; bis(2,2,6,6-tetramethyl-4-piperidyl) sebacate (molecular weight, 481); tetrakis(2,2,6,6-tetramethyl-4-piperidyl)-1,2,3,4-butanetetracarboxylate (molecular weight, 791); tetrakis(1,2,2,6,6-pentamethyl-4-piperidyl)-1,2,3,4-butanetetracarboxylate (molecular weight, 847); a mixture (molecular weight, 900) of 2,2,6,6-tetramethyl-4-piperidyl-1,2,3,4-butanetetracarboxylate and tridecyl-1,2,3,4-butanetetracarboxylate; and a mixture (molecular weight, 900) of 1,2,2,6,6-pentamethyl-4-piperidyl-1,2,3,4-butanetetracarboxylate and tridecyl-1,2,3,4-butanetetracarboxylate.

Examples of the hindered amine-type light stabilizers having a high molecular weight include: poly[{6-(1,1,3,3-tetramethylbutyl)amino-1,3,5-triazine-2,4-diyl}{(2,2,6,6-tetramethyl-4-piperidyl)imino}hexamethylene {(2,2,6,6-tetramethyl-4-piperidy)imino}](molecular weight, 2,000-3,100); a polymer (molecular weight, 3,100-4,000) of dimethyl succinate with 4-hydroxy-2,2,6,6-tetramethyl-1-piperidineethanol; a mixture of N,N',N'',N'''-tetrakis(4,6-bis-(butyl(N-methyl-2,2,6,6-tetramethylpiperidin-4-yl)amino)-triazin-2-yl)-4,7-diazadecane-1,10-diamine(molecular weight, 2,286) with the polymer of dimethyl succinate with 4-hydroxy-2,2,6,6-tetramethyl-1-piperidineethanol; polycondensates (molecular weight, 2,600-3,400) of dibutylamine, 1,3,5-triazine, and N,N'-bis(2,2,6,6-tetramethyl-4-piperidyl-1,6-hexamethylenediamine with N-(2,2,6,6-tetramethyl-4-piperidyl)butylamine; and copolymers of cyclic aminovinyl compounds, such as 4-acryloyloxy-2,2,6,6-tetramethylpiperidine, 4-acryloyloxy-1,2,2,6,6-pentamethylpiperidine, 4-acryloyloxy-1-ethyl-2,2,6,6-tetramethylpiperidine, 4-acryloyloxy-1-propyl-2,2,6,6-tetramethylpiperidine, 4-acryloyloxy-1-butyl-2,2,6,6-tetramethylpiperidine, 4-methacryloyloxy-2,2,6,6-tetramethylpiperidine, 4-methacryloyloxy-1,2,2,6,6-pentamethylpiperidine,4-4-methacryloyloxy-1-ethyl-2,2,6,6-tetramethylpiperidine, 4-methacryloyloxy-1-butyl-2,2,6,6-tetramethylpiperidine, 4-crotonoyloxy-2,2,6,6-tetramethylpiperidine, and 4-crotonoyloxy-1-propyl-2,2,6,6-tetramethylpiperidine, with ethylene. One of the hindered amine-type light stabilizers enumerated above may be used alone, or a mixture of two or more thereof may be used.

As the hindered amine-type light stabilizer, it is preferred to use the following ones among those shown above: poly[{6-(1,1,3,3-tetramethylbutyl)amino-1,3,5-triazine-2,4-diyl} {2,2,6,6-tetramethyl-4-piperidyl) imino}hexamethylene{(2,2,6,6-tetramethyl-4-piperidyl) imino}] (molecular weight, 2,000-3,100); a polymer (molecular weight, 3,100-4,000) of dimethyl succinate with 4-hydroxy-2,2,6,6-tetramethyl-1-piperidineethanol; a mixture of N,N',N'',N'''-tetrakis(4,6-bis(butyl(N-methyl-2,2,6,6-tetramethylpiperidin-4-yl)amino)triazin-2-yl)-4,7-diazadecane-1,10-diamine (molecular weight, 2,286) with the polymer of dimethyl succinate with 4-hydroxy-2,2,6,6-tetramethyl-1-piperidineethanol; polycondensates (molecular weight, 2,600-3,400) of dibutylamine, 1,3,5-triazine, and N,N'-bis(2,2,6,6-tetramethyl-4-piperidyl-1,6-hexamethylenediamine with N-(2,2,6,6-tetramethyl-4-piperidyl)butylamine; and copolymers of cyclic aminovinyl compounds with ethylene. This is because these light stabilizers can be prevented from bleeding out with the lapse of time during use of the products. Meanwhile, from the standpoint of ease of production of the composition, it is preferred to use a hindered amine-type light stabilizer having a melting point of 60° C. or higher.

In the invention, it is desirable that the content of the hindered amine-type light stabilizer, per 100 parts by weight of the ethylene/α-olefin copolymer, should be 0.01-2.5 parts by weight, preferably 0.01-1.0 part by weight, more preferably 0.01-0.5 parts by weight, even more preferably 0.01-0.2 parts by weight, most preferably 0.03-0.1 part by weight.

By regulating the content thereof to 0.01 part by weight or larger, a stabilizing effect is sufficiently obtained. By regulating the content thereof to 2.5 parts by weight or less, the resin can be inhibited from being discolored by excessive addition of the hindered amine-type light stabilizer.

In the invention, the weight ratio of the organic peroxide (B) to the hindered amine-type light stabilizer (C), B/C, is regulated to from 1/0.01 to 1/10, preferably from 1/0.02 to 1/6.5. Thus, the resin can be remarkably inhibited from yellowing.

(4) Crosslinking Aid

A crosslinking aid can be incorporated into the resin composition of the invention. A crosslinking aid is effective in accelerating the crosslinking reaction and heightening the degree of crosslinking of the ethylene/α-olefin copolymer. Specific examples thereof include polyunsaturated compounds such as polyallyl compounds and poly(meth)acryloxy compounds.

More specific examples thereof include polyallyl compounds such as triallyl isocyanurate, triallyl cyanurate, diallyl phthalate, diallyl fumarate, and diallyl maleate, poly(meth)acryloxy compounds such as ethylene glycol diacrylate, ethylene glycol dimethacrylate, and trimethylolpropane trimethacrylate, and divinylbenzene. Such a crosslinking aid can be incorporated in a proportion of about 0-5 parts by weight per 100 parts by weight of component (A).

(5) Ultraviolet Absorber

An ultraviolet absorber can be incorporated into the resin composition of the invention. Examples of the ultraviolet absorber include ultraviolet absorbers of various types including benzophenone-based, benzotriazole-based, triazine-based, and salicylic-ester-based ultraviolet absorbers.

Examples of the benzophenone-based ultraviolet absorbers include 2-hydroxy-4-methoxybenzophenone, 2-hydroxy-4-methoxy-2'-carboxybonzophenone, 2-hydroxy-4- n-octoxybenzophenone, 2-hydroxy-4-n-dodecyloxybenzophenone, 2-hydroxy-4-n-octadecyloxybenzophenone, 2-hydroxy-4-benzyloxybenzophenone, 2-hydroxy-4-methoxy-5-sulfobenzophenone, 2-hydroxy-5-chlorobenzophenone, 2,4-dihydroxybenzophenone, 2,2'-dihydroxy-4-methoxybenzophenone, 2,2'-dihydroxy-4,4'-dimethoxybenzophenone, and 2,2',4,4'-tetrahydroxybenzophenone.

The benzotriazole-based ultraviolet absorbers are hydroxyphenyl-substituted benzotriazole compounds, and examples thereof include 2-(2-hydroxy-5-methylphenyl)benzotriazole, 2-(2-hydroxy-5-t-butylphenyl)benzotriazole, 2-(2-hydroxy-3,5-dimethylphenyl)benzotriazole, 2-(2-methyl-4-hydroxyphenyl)benzotriazole, 2-(2-hydroxy-3-methyl-5-t-butylphenyl)benzotriazole, 2-(2-hydroxy-3,5-di-t-amylphenyl)benzotriazole, and 2-(2-hydroxy-3,5-di-t-butylphenyl)benzotriazole. Examples of the triazine-based ultraviolet absorbers include 2-[4,6-bis(2,4-dimethylphenyl)-1,3,5-triazin-2-yl]-5-(octyloxy)phenol and 2-(4,6-diphenyl-1,3,5-triazin-2-yl)-5-(hexyloxy)phenol. Examples of the salicylic-ester-based absorbers include phenyl salicylate and p-octylphenyl salicylate.

It is desirable that these ultraviolet absorbers should be incorporated in an amount of 0-2.0 parts by weight, preferably 0.05-2.0 parts by weight, more preferably 0.1-1.0 part by weight, even more preferably 0.1-0.5 parts by weight, most preferably 0.2-0.4 parts by weight, per 100 parts by weight of the ethylene/α-olefin copolymer.

(6) Silane Coupling Agent

In the resin composition of the invention, a silane coupling agent can be used mainly for the purpose of improving the strength of adhesion to the upper protective material of a solar cell and to the solar cell element.

Examples of the silane coupling agent in the invention include γ-chloropropyltrimethoxysilane, vinyltrichlorosilane, vinyltriethoxysilane, vinyltrimethoxysilane, vinyltris(β-methoxyethoxy)silane, γ-methacryloxypropyltrimethoxysilane, β-(3,4-epoxycyclohexyl)ethyltrimethoxysane, γ-glycidoxypropyltrimethoxysilane, vinyltriacetoxysilane, γ-mercaptopropyltrimethoxysilane, γ-aminopropyltrimethoxysilane, N-β-(aminoethyl)-γ-aminopropyltrimethoxysilane, and 3-acryloxypropyltrimethoxysilane. Preferred are vinyltrimethoxysilane, γ-methacryloxypropyltrimethoxysilane, and 3-acryloxypropyltrimethoxysilane.

These silane coupling agents may be used in an amount of 0-5 parts by weight per 100 parts by weight of the ethylene/α-olefin copolymer, and is used in an amount of preferably 0.01-4 parts by weight, more preferably 0.01-2 parts by weight, even more preferably 0.05-1 part by weight.

(7) Other Additive Ingredients

Other additive ingredients can be optionally incorporated into the resin composition of the invention so long as this incorporation does not considerably defeat the objects of the invention. Examples of such optional ingredients include ones in use in ordinary polyolefin-based resinous materials, such as antioxidants, crystal nucleating agents, clarifiers, lubricants, colorants, dispersants, fillers, fluorescent brighteners, ultraviolet absorbers, and light stabilizers.

Furthermore, a crystalline ethylene/α-olefin copolymer obtained by polymerization using a Ziegler or metallocene catalyst and/or a rubbery compound, e.g., an ethylene/α-olefin elastomer such as EBR or EPR or a styrene-based elastomer such as SEBS or a hydrogenated styrene block copolymer, can be incorporated into the resin composition of the invention in an amount of 3-75 parts by weight in order to impart flexibility, etc., so long as this incorporation does not defeat the objects of the invention. Moreover, it is also possible to incorporate high-pressure-process low-density polyethylene in an amount of 3-75 parts by weight in order to impart melt tension, etc.

2. Solar Cell Encapsulant and Solar Cell Module

The solar cell encapsulant (hereinafter referred to also as encapsulant) of the invention is one obtained by forming the resin composition into pellets or into a sheet.

By using this solar cell encapsulant to fix a solar cell element together with upper and lower protective materials, a solar cell module can be fabricated. Examples of such solar cell modules include ones of various types. Specifically, the examples include: a solar cell module having a configuration wherein a solar cell element is sandwiched between encapsulant from both sides thereof, such as upper transparent protective material/encapsulant/solar cell element/encapsulant/lower protective material; a solar cell module having a configuration wherein a encapsulant and an upper transparent protective material are disposed over a solar cell element formed on the inner circumferential surface of a lower substrate protective material; and a solar cell module having a configuration wherein a encapsulant and a lower protective material are disposed over a solar cell element formed on the inner circumferential surface of an upper transparent protective material, for example, over a structure obtained by forming an amorphous solar cell element on a fluororesin-based transparent protective material by sputtering or the like.

The solar cell element is not particularly limited, and use can be made of various solar cell elements including silicon elements such as single-crystal silicon, polycrystalline silicon, and amorphous silicon and Group III-V or Group II-VI compound semiconductor elements such as gallium-arsenic, copper-indium-selenium, and cadmium-tellurium. In the invention, a solar cell element employing a glass as the substrate is preferred.

Examples of the upper protective material as a constituent component of the solar cell module include glasses, acrylic resins, polycarbonates, polyesters, and fluororesins.

The lower protective material is a single material, such as a metal or any of various thermoplastic-resin films, or a multilayer sheet of such materials. Examples thereof include single-layer or multilayered protective materials such as inorganic materials including metals, e.g., tin, aluminum, and stainless steel, and glasses, polyesters, polyesters coated with an inorganic substance by vapor deposition, fluororesins, and polyolefins. Such upper and/or lower protective materials can be primed in order to heighten the adhesiveness to the encapsulant. In the invention, a glass is preferred as the upper protective material.

Although the solar cell encapsulant of the invention may be used as pellets, the encapsulant is usually used in the form of a sheet having a thickness of about 0.1-1 mm. In case where the thickness thereof is less than 0.1 mm, this sheet may have low strength and insufficient adhesion may result. In case where the thickness thereof is larger than 1 mm, this encapsulant may have reduced transparency to pose a problem. The thickness thereof is preferably 0.1-0.8 mm.

The sheet-shaped solar cell encapsulant can be produced by a known sheet molding method in which a T-die extruder, a calendering machine, or the like is used. For example, the crosslinking agent is added to the ethylene/α-olefin copolymer, and this mixture is dry-blended beforehand, according to need, with a hindered amine-type light stabilizer and with additives such as a crosslinking aid, silane coupling agent, ultraviolet absorber, antioxidant, and light stabilizer. This composition is fed to a T-die extruder through the hopper thereof, and extrusion-molded into a sheet at an extrusion temperature of 80-150° C. Thus, the sheet-shaped encapsulant can be obtained. In the dry-blending, some or all of the additives can be used in the form of a master batch. Furthermore, in the T-die extrusion or calendering, use can be made of a resin composition obtained beforehand by melt-mixing a noncrystalline α-olefin-based copolymer with some or all of the additives using a single-screw extruder, twin-screw extruder, Banbury mixer, kneader, or the like.

The sheet obtained by molding is wound on a paper tube for the purpose of facilitating the storage and transportation thereof. However, there are cases where the wound sheet adheres to itself (blocking). Once blocking has occurred, this sheet cannot be stably unwound when the sheet is to be unwound and used in the next step, resulting in a decrease in production efficiency.

When a solar cell module is produced, use may be made of a method in which a sheet of the encapsulant of the invention is formed beforehand and is subjected to press-bonding at a temperature at which the resin composition of the encapsulant melts, for example, 150-200° C. Thus, a module having any of the configurations described above can be fabricated. Meanwhile, in cases when a method is employed in which the encapsulant of the invention is applied by extrusion coating to thereby laminate the encapsulant to a solar cell element or to an upper protective material or lower protective material, a solar cell module can be produced in one step without necessitating the trouble of sheet molding.

Meanwhile, when a solar cell module is produced, use may be made of a method in which the encapsulant is provisionally bonded to a solar cell element or protective materials at such a temperature that the organic peroxide does not substantially decompose and that the encapsulant of the invention melts, and this provisionally bonded encapsulant is then heated to conduct sufficient bonding and crosslink the ethylene/α-olefin copolymer. In this case, from the standpoint of obtaining a solar cell module having satisfactory heat resistance and including encapsulant layers with a melting point (DSC method) of 85° C. or higher and a storage modulus at 150° C. of $10^3$ Pa or higher, it is desirable to crosslink the copolymer so that the encapsulant layers have a gel content (determined by immersing 1 g of a sample in 100 mL of xylene, heating this xylene at 110° C. for 24 hours, subsequently filtering the xylene with a 20-meth metal screen, and measuring the proportion by mass of the undissolved components) of about 50-98%, preferably about 70-95%.

As a method for sealing a solar cell element, there is a method in which: the solar cell element is covered with the encapsulant of the invention; the encapsulant is thereafter heated for several minutes to about 10 minutes at such a temperature that the organic peroxide does not decompose, thereby provisionally bond the encapsulant; and then this structure is heat-treated in an oven for 5-30 minutes at a high temperature of about 150-200° C. at which the organic peroxide decomposes, thereby bonding the encapsulant.

Since the number of branches (N) in component (A) and the total number of vinyl and vinylidene (V) therein satisfy the specific relationship described hereinabove, the encapsulant of the invention has improved crosslinking properties and a solar cell module having excellent heat resistance can be obtained.

EXAMPLES

The invention will be explained below by reference to Examples, but the invention should not be construed by being limited by the following Examples. The evaluation methods and resins used in the Examples and Comparative Examples are as follows.

1. Methods for evaluating Resin Properties (1) Melt Flow Rate (MFR): As stated hereinabove, the MFR of an ethylene/α-olefin copolymer was measured in accordance with JIS-K6922-2: 1997 appendix (190° C., 21.18-N load).

(2) Density: As stated hereinabove, the density of an ethylene/α-olefin copolymer was measured in accordance with JIS-K6922-2: 1997 appendix (23° C.; in the case of low-density polyethylene).

(3) Number of Branches and Number of Double Bonds: The number of branches (N) in a polymer and the number of vinyl and vinylidene (V) therein were determined through examination by $^{13}$C-NMR spectroscopy and $^1$H-NMR spectroscopy, respectively, under the following conditions. The comonomer amounts were determined in terms of the number of units per total of 1,000 carbon atoms contained in the main chain and side chains.

Apparatus: AVANCE III cryo-400 MHz; Bruker Biospin K. K.

Solvent: o-dichlorobenzene/deuterated bromobenzene=8/2 mixed solution
<Sample Amount>
460 mg/2.3 mL
<$^{13}$C-NMR>
$^1$H decoupling, with NOE
Number of integrations: 256 scans
Flip angle: 90°
Pulse interval, 20 sec
AQ (acquisition time)=5.45 s
D1 (delay time)=14.55 s
<$^1$H-NMR>
Number of integrations: 1,400 scans
Flip angle: 1.03°
AQ (acquisition time)=1.8 s
D1 (delay time)=0.01 s 2. Methods for evaluating Extrudate (Sheet)

(1) Haze

Pellets obtained were preheated for 3 minutes under the conditions of 150° C. and 0 kg/cm$^2$, subsequently pressed for 27 minutes under the conditions of 150° C. and 100 kg/cm$^2$ (press-molded at 150° C. for 30 minutes), and then cooled for 10 minutes with a cold press set at 30° C. under the pressure conditions of 100 kg/cm$^2$, thereby producing a crosslinked sheet having a thickness of 0.7 mm. The press-molded sheet having a thickness of 0.7 mm was examined in accordance with JIS-K7136-2000. A piece of the press-molded sheet was set in a cell filled with liquid paraffin (manufactured by Kanto Chemical Co. Inc.). The smaller the value of haze, the better the sheet.

(2) Luminous transmittance

Pellets obtained were preheated for 3 minutes under the conditions of 150° C. and 0 kg/cm$^2$, subsequently pressed for 27 minutes under the conditions of 150° C. and 100 kg/cm$^2$ (press-molded at 150° C. for 30 minutes), and then cooled for 10 minutes with a cold press set at 30° C. under the pressure conditions of 100 kg/cm$^2$, thereby producing a crosslinked sheet having a thickness of 0.7 mm. The press-molded sheet having a thickness of 0.7 mm was examined in accordance with JIS-K7361-1-1997. A piece of the press-molded sheet was set in a cell filled with liquid paraffin (manufactured by Kanto Chemical Co. Inc.).

The luminous transmittance thereof is 80% or higher, preferably 85% or higher, more preferably 90% or higher.

(3) Tensile Modulus

Pellets obtained were preheated for 3 minutes under the conditions of 150° C. and 0 kg/cm$^2$, subsequently pressed for 27 minutes under the conditions of 150° C. and 100 kg/cm$^2$ (press-molded at 150° C. for 30 minutes), and then cooled for 10 minutes with a cold press set at 30° C. under the pressure conditions of 100 kg/cm$^2$, thereby producing a crosslinked sheet having a thickness of 0.7 mm. The press-molded sheet having a thickness of 0.7 mm was examined in accordance with ISO 1184-1983. Under the conditions of a pulling speed of 1 mm/min, specimen width of 10 mm, and chuck-to-chuck distance of 100 mm, the tensile modulus at an elongation of 1% was determined. The larger the value thereof, the better the rigidity and impact resistance.

(4) Heat Resistance

Pellets obtained were preheated for 3 minutes under the conditions of 150° C. and 0 kg/cm$^2$, subsequently pressed for 27 minutes under the conditions of 150° C. and 100 kg/cm$^2$ (press-molded at 150° C. for 30 minutes), and then cooled for 10 minutes with a cold press set at 30° C. under the pressure conditions of 100 kg/cm$^2$, thereby producing a crosslinked sheet having a thickness of 0.7 mm. The heat resistance of the sheet having a thickness of 0.7 mm was evaluated in terms of gel content. The higher the gel content, the more the crosslinking has proceeded; sheets having a high gel content can be rated as high in heat resistance. Sheets having a gel content of 70 wt % or higher were rated as "good" in heat resistance. The gel content is determined by cutting an about 1-g portion out of the sheet, precisely weighing this sample, immersing the sample in 100 cc of xylene and treating the mixture at 110° C. for 24 hours, filtering the mixture, thereafter drying the residue, precisely weighing the dried residue, and dividing the weight thereof by the weight of the untreated sample to calculate the gel content.

(5) Non-blocking Property of Sheet

Pellets obtained were preheated for 3 minutes under the conditions of 100° C. and 0 kg/cm$^2$, subsequently pressed for 2 minutes under the conditions of 100° C. and 100 kg/cm$^2$, and then cooled for 3 minutes with a cold press set at 30° C. under the pressure conditions of 100 kg/cm$^2$, thereby producing an uncrosslinked sheet having a thickness of 0.7 mm. This press-molded sheet having a thickness of 0.7 mm was evaluated. The sheet was superposed on itself and examined for adhesion between the sheet layers. The sheets which showed no adhesion between sheet layers were rated as "good" in non-blocking property, those which showed slight adhesion between sheet layers were rated as "fair" in non-blocking property, and those which showed considerable adhesion between sheet layers were rated as "poor" in non-blocking property.

3. Raw Materials used (1) Component (A): Ethylene/α-olefin copolymers
(PE-1): Exact 8230, manufactured by DEX Plastomers
(PE-2): Exact 8210, manufactured by DEX Plastomers
(PE-3): Production process is described below under <Processes for producing PE-3, PE-5, and PE-13 to PE-17>
(PE-4): Tafmer P-0180, manufactured by Mitsui Chemicals, Inc.
(PE-5): Production process is described below under <Processes for producing PE-3, PE-5, and PE-13 to PE-17>
(PE-6): Tafmer P-0275, manufactured by Mitsui Chemicals, Inc.
(PE-7): Exact 5008, manufactured by Exxon Mobil Corp.
(PE-8): Tafmer P-0280, manufactured by Mitsui Chemicals, Inc.
(PE-9): Exact 4041, manufactured by Exxon Mobil Corp.
(PE-10): Engage 8401, manufactured by The Dow Chemical
(PE-11): Tafmer A-4050S, manufactured by Mitsui Chemicals, Inc.
(PE-12): Tafmer A-4070S, manufactured by Mitsui Chemicals, Inc.
(PE-13) to (PE-17): Production process is described below under <Processes for producing PE-3, PE-5, and PE-13 to PE-17>

Incidentally, PE-1 to PE-8 and PE-13 to PE-15 were used in the Examples, and PE-9 to PE-12, PE-16, and PE-17 were used in the Comparative Examples.

The properties thereof are shown in Table 1.

<Processes for producing PE-3, PE-5, and PE-13 to PE-17>

(i) Catalyst Preparation

To 0.05 mol of the complex "rac-dimethylsilylenebisindenylhafnium dimethyl" prepared by the method described in JP-A-10-218921 was added an equimolar amount of "N,N-dimethylanilinium tetrakis(pentafluorophenyl)borate". This mixture was diluted with toluene to 50 L, thereby preparing a catalyst solution.

(ii) Polymerization Method for PE-3

A stirring type continuous autoclave reactor having a capacity of 5.0 L was used. While keeping the internal pressure of the reactor at 80 MPa, ethylene, propylene, and 1-hexene were continuously supplied as starting-material gases at a rate of 40 kg/hr so that the proportions of ethylene, propylene, and 1-hexene were 34.4% by weight, 26.3% by weight, and 39.2% by weight, respectively. Furthermore, the catalyst solution described above in the section "(i) Catalyst Preparation" was continuously supplied, and the feed rate thereof was regulated so that the polymerization temperature was kept at 213° C. The polymer production amount per hour was about 3.9 kg. After completion of the reaction, an ethylene/propylene/1-hexene copolymer (PE-3) having a propylene content of 12.1% by weight, a 1-hexene content of 11.3% by weight, an MFR of 30 g/10 min, and a density of 0.880 g/cm$^3$ was obtained.

(iii) Polymerization Method for PE-5

A stirring type continuous autoclave reactor having a capacity of 5.0 L was used. While keeping the internal pressure of the reactor at 80 MPa, ethylene, propylene, and 1-hexene were continuously supplied as starting-material gases at a rate of 40 kg/hr so that the proportions of ethylene, propylene, and 1-hexene were 37.8% by weight, 25.6% by weight, and 36.6% by weight, respectively. Furthermore, the catalyst solution described above in the section "(i) Catalyst Preparation" was continuously supplied, and the feed rate thereof was regulated so that the polymerization temperature was kept at 165° C. The polymer production amount per hour was about 4.0 kg. After completion of the reaction, an ethylene/propylene/1-hexene copolymer (PE-5) having a propylene content of 11.9% by weight, a 1-hexene content of 10.7% by weight, an MFR of 2.2 g/10 min, and a density of 0.880 g/cm$^3$ was obtained.

(iv) Polymerization Method for PE-13 to PE-17

Ethylene/1-octene copolymers (PE-13 to PE-17) were obtained in accordance with the polymerization methods for PE-3 and PE-5 described above, by regulating the feed rates of ethylene and 1-octene and polymerization temperature.

(2) Organic Peroxide: 2,5-Dimethyl-2,5-di(t-butylperoxy)hexane (Luperox 101, manufactured by ARKEMA Yoshitomi, Ltd.)

(3) Hindered amine-type Light Stabilizer: A polymer of dimethyl succinate with 4-hydroxy-2,2,6,6-tetramethyl-1-piperidineethanol (TINUVIN 622LD, manufactured by BASF A. G.)

(4) Ultraviolet Absorber: 2-Hydroxy-4-n-octoxybenzophenone (CYTEC UV531, manufactured by Sun Chemical Company)

TABLE 1

| | Comonomer | MFR g/10 min | Density g/cm³ | Number of branches (N) branches/total 1,000 C atoms | Vinyl units/total 1,000 C atoms | Vinylidene units/total 1,000 C atoms | Vinyl + Vinyidene (V) units/total 1,000 C atoms | N × V |
|---|---|---|---|---|---|---|---|---|
| PE1 | C8 | 30 | 0.882 | 36.1 | 0.16 | 0.23 | 0.39 | 14.1 |
| PE2 | C8 | 10 | 0.882 | 35.3 | 0.15 | 0.23 | 0.38 | 13.4 |
| PE3 | C3/C6 | 30 | 0.880 | 59.2 | 0.21 | 0.22 | 0.43 | 25.5 |
| PE4 | C3 | 4 | 0.870 | 88.4 | 0.03 | 0.12 | 0.15 | 13.3 |
| PE5 | C3/C6 | 2.2 | 0.880 | 57.4 | 0.11 | 0.11 | 0.22 | 12.6 |
| PE6 | C3 | 3 | 0.860 | 103.9 | 0.02 | 0.10 | 0.12 | 12.5 |
| PE7 | C4 | 10 | 0.865 | 76.3 | 0.05 | 0.11 | 0.16 | 12.2 |
| PE8 | C3 | 3 | 0.870 | 92.1 | 0.03 | 0.09 | 0.12 | 11.1 |
| PE13 | C8 | 33 | 0.881 | 41.1 | 0.14 | 0.21 | 0.35 | 14.4 |
| PE14 | C8 | 25 | 0.891 | 34.5 | 0.33 | 0.39 | 0.72 | 24.8 |
| PE15 | C8 | 36 | 0.878 | 42.5 | 0.25 | 0.41 | 0.66 | 28.0 |
| PE9 | C4 | 3 | 0.878 | 58.3 | 0.05 | 0.09 | 0.14 | 8.2 |
| PE10 | C8 | 30 | 0.885 | 37.9 | 0.06 | 0.15 | 0.21 | 8.0 |
| PE11 | C4 | 3.6 | 0.860 | 77.3 | 0.02 | 0.02 | 0.04 | 3.1 |
| PE12 | C4 | 3.6 | 0.870 | 69.3 | 0.02 | 0.02 | 0.04 | 2.8 |
| PE16 | C8 | 28 | 0.900 | 28.6 | 0.07 | 0.08 | 0.15 | 4.3 |
| PE17 | C8 | 24 | 0.903 | 27.2 | 0.08 | 0.10 | 0.18 | 4.9 |

<Comonomers> C3: propylene, C4: 1-butene, C6: 1-hexene, C8: 1-octene

Example 1

To 100 parts by weight of an ethylene/1-octene copolymer (PE-1) were added 1.5 parts by weight of 2,5-dimethyl-2,5-di(t-butylperoxy)hexane (Luperox 101, manufactured by ARKEMA Yoshitomi, Ltd.) as organic peroxide, 0.05 parts by weight of a polymer of dimethyl succinate with 4-hydroxy-2,2,6,6-tetramethyl-1-piperidineethanol (TINUVIN 622LD, manufactured by BASF A. G.) as a hindered amine-type light stabilizer, and 0.3 parts by weight of 2-hydroxy-4-n-octoxybenzophenone (CYTEC UV531, manufactured by Sun Chemical Company) as an ultraviolet absorber. These ingredients were sufficiently mixed together and pelletized using a 40-mm (diameter) single-screw extruder under the conditions of a set temperature of 130° C. and an extrusion rate of 17 kg/hr.

The pellets obtained were used to evaluate haze, luminous transmittance, tensile modulus, heat resistance, and non-blocking property. The results of the evaluation are shown in Table 2.

Example 2

A sheet was produced in the same manner as in Example 1, except that PE-2 was used in place of the PE-1. The results of the evaluation are shown in Table 2.

Example 3

A sheet was produced in the same manner as in Example 1, except that PE-3 was used in place of the PE-1. The results of the evaluation are shown in Table 2.

Example 4

A sheet was produced in the same manner as in Example 1, except that PE-4 was used in place of the PE-1. The results of the evaluation are shown in Table 2.

Example 5

A sheet was produced in the same manner as in Example 1, except that PE-5 was used in place of the PE-1. The results of the evaluation are shown in Table 2.

Example 6

A sheet was produced in the same manner as in Example 1, except that PE-6 was used in place of the PE-1. The results of the evaluation are shown in Table 2.

Example 7

A sheet was produced in the same manner as in Example 1, except that PE-7 was used in place of the PE-1. The results of the evaluation are shown in Table 2.

Example 8

A sheet was produced in the same manner as in Example 1, except that PE-8 was used in place of the PE-1. The results of the evaluation are shown in Table 2.

Example 9

A sheet was produced in the same manner as in Example 1, except that PE-13 was used. The results of the evaluation are shown in Table 2.

Example 10

A sheet was produced in the same manner as in Example 1, except that PE-14 was used. The results of the evaluation are shown in Table 2.

Example 11

A sheet was produced in the same manner as in Example 1, except that PE-15 was used. The results of the evaluation are shown in Table 2.

Comparative Example 1

A sheet was produced in the same manner as in Example 1, except that PE-9 was used in place of the ethylene/1-octene copolymer (PE-1). The results of the evaluation are shown in Table 2.

Comparative Example 2

A sheet was produced in the same manner as in Example 1, except that PE-10 was used in place of the PE-1. The results of the evaluation are shown in Table 2.

Comparative Example 3

A sheet was produced in the same manner as in Example 1, except that PE-11 was used in place of the PE-1. The results of the evaluation are shown in Table 2.

Comparative Example 4

A sheet was produced in the same manner as in Example 1, except that PE-12 was used in place of the PE-1. The results of the evaluation are shown in Table 2.

Comparative Example 5

A sheet was produced in the same manner as in Example 1, except that PE-16 was used in place of the PE-1. The results of the evaluation are shown in Table 2.

Comparative Example 6

A sheet was produced in the same manner as in Example 1, except that PE-17 was used in place of the PE-1. The results of the evaluation are shown in Table 2.

Evaluation

As a result, as apparent from Table 2, the sheets obtained through 30-minute crosslinking at 150° C. showed a higher value of gel content in Examples 1 to 11 than in Comparative Examples 1 to 6. It can hence be seen that the sheets of the Examples have satisfactory crosslinking properties and high heat resistance as compared with the sheets of the Comparative Examples.

The sheets obtained in Examples 1, 2, and 9 to 11, among all the Examples, in which 1-octene (C8) had been used as the α-olefin of the ethylene/α-olefin copolymers, had a higher tensile modulus as compared with the sheets of the other Examples. These results indicate that sheets obtained from ethylene/α-olefin produced using 1-octene (C8) as a comonomer are excellent in terms of rigidity and impact resistance. It can be further seen that these sheets are excellent also in terms of non-blocking property.

With respect to haze, Comparative Example 3 had a relatively high value of 10.0%, whereas Examples 1 to 11 each had a satisfactory value of 2.5% or less. Meanwhile, with respect to luminous transmittance, Examples 1 to 11 each showed 90% or higher, showing that the sheets obtained from the invention have excellent transparency.

INDUSTRIAL APPLICABILITY

The resin composition for solar cell encapsulant of the invention not only has satisfactory crosslinking properties and high heat resistance but is excellent in terms of transparency, impact resistance, etc. The resin composition is hence advantageously utilized as solar cell encapsulant. In particular, the resin composition is useful for thin-film solar cells and solar cell modules.

TABLE 2

| | Comonomer | N × V | Internal haze % | Luminous transmittance % | Gel content % | Heat resistance Rating | Tensile modulus Mps | Non-blocking property |
|---|---|---|---|---|---|---|---|---|
| Example 1 | C8 | 14.1 | 0.8 | 91.9 | 71% | good | 19.0 | good |
| Example 2 | C8 | 13.4 | 0.8 | 91.9 | 90% | good | 19.9 | good |
| Example 3 | C3/C6 | 25.5 | 0.7 | 92.2 | 84% | good | 16.2 | fair |
| Example 4 | C3 | 13.3 | 2.2 | 91.2 | 88% | good | 6.7 | poor |
| Example 5 | C3/C6 | 12.6 | 0.8 | 92.2 | 92% | good | 17.2 | fair |
| Example 6 | C3 | 12.5 | 2.3 | 90.8 | 91% | good | 5 | poor |
| Example 7 | C4 | 12.2 | 0.5 | 92.3 | 71% | good | 6.7 | poor |
| Example 8 | C3 | 11.1 | 2.2 | 91.2 | 85% | good | 6.8 | poor |
| Example 9 | C8 | 14.4 | 0.7 | 92.0 | 72% | good | 18.2 | good |
| Example 10 | C8 | 24.8 | 0.8 | 92.0 | 71% | good | 33.8 | good |
| Example 11 | C8 | 28.0 | 0.6 | 92.0 | 76% | good | 15.3 | good |
| Comparative Example 1 | C4 | 8.2 | 0.8 | 91.8 | 67% | poor | 16.8 | fair |
| Comparative Example 2 | C8 | 8.0 | 0.6 | 92.2 | 47% | poor | 22.5 | good |
| Comparative Example 3 | C4 | 3.1 | 10.0 | 91.1 | 60% | poor | 5.2 | poor |
| Comparative Example 4 | C4 | 2.8 | 2.2 | 90.8 | 58% | poor | 6.5 | poor |
| Comparative Example 5 | C8 | 4.3 | 0.7 | 92.0 | 58% | poor | 55.9 | good |
| Comparative Example 6 | C8 | 4.9 | 0.8 | 92.0 | 51% | poor | 61.6 | good |

<Comonomers> C3: propylene, C4: 1-butene, C6: 1-hexene, C8: 1-octene

The invention claimed is:

1. A resin composition for solar cell encapsulant which comprises the following component (A) and component (B):
   component (A): an ethylene/α-olefin copolymer having the following properties (a1) to (a3):
   (a1) a branch number derived from comonomer (N) and a total number of vinyl and vinylidene (V) in the ethylene/α-olefin copolymer satisfy the following relationship of expression (1):

$$N \times V \geq 10 \qquad \text{expression (1)}$$

wherein N and V are the number, as determined by NMR, per total of 1,000 carbon atoms contained in the main chain and side chain,
   (a2) an MFR (190° C., 21.18-N load) is 0.1-100 g/10 min, and
   (a3) a density is 0.860-0.920 g/cm³,
   component (B): organic peroxide.

2. The resin composition for solar cell encapsulant according to claim 1, wherein the component (A) is an ethylene/α-olefin copolymer which further has the following property (a4):
   (a4) a branch number derived from comonomer (N) in the ethylene/α-olefin copolymer satisfies the following relationship of expression (2):

$$0 < N < 54.0 \qquad \text{expression (2)}$$

wherein N is the number, as determined by NMR, per total of 1,000 carbon atoms contained in the main chain and side chains.

3. The resin composition for solar cell encapsulant according to claim 1, wherein the content of component (B) is 0.2-5 parts by weight per 100 parts by weight of component (A).

4. The resin composition for solar cell encapsulant according to claim 1, which further comprises the following component (C):
   component (C): a hindered amine-type light stabilizer.

5. The resin composition for solar cell encapsulant according to claim 4, wherein the content of component (C) is 0.01-2.5 parts by weight per 100 parts by weight of component (A).

6. The resin composition for solar cell encapsulant according to claim 1, wherein the number of carbon atoms in the α-olefin of component (A) is 8-20.

7. The resin composition for solar cell encapsulant according to claim 1, wherein the α-olefin of component (A) is 1-octene.

8. A solar cell encapsulant formed from the resin composition for solar cell encapsulant according to claim 1.

9. A solar cell module using the solar cell encapsulant according to claim 8.

10. The resin composition for solar cell encapsulant according to claim 1, wherein the total number of vinyl and vinylidene (V) in the ethylene/α-olefin copolymer is 0.17 or larger.

11. The resin composition for solar cell encapsulant according to claim 1, wherein the total number of vinyl and vinylidene (V) in the ethylene/α-olefin copolymer is 0.20 or larger.

12. The resin composition for solar cell encapsulant according to claim 1, wherein the resin contained in the resin composition consists essentially of the ethylene/α-olefin copolymer of component (A).

* * * * *